United States Patent
Wu et al.

(10) Patent No.: US 9,711,477 B2
(45) Date of Patent: *Jul. 18, 2017

(54) DUMMY FLIP CHIP BUMPS FOR REDUCING STRESS

(71) Applicant: Taiwan Semiconductor Manufacturing Company, Ltd., Hsin-Chu (TW)

(72) Inventors: Sheng-Yu Wu, Hsin-Chu (TW); Tin-Hao Kuo, Hsin-Chu (TW); Chita Chuang, Hsin-Chu (TW); Chen-Shien Chen, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/054,357

(22) Filed: Feb. 26, 2016

(65) Prior Publication Data

US 2016/0181220 A1  Jun. 23, 2016

Related U.S. Application Data

(60) Continuation of application No. 14/491,309, filed on Sep. 19, 2014, now Pat. No. 9,287,234, which is a
(Continued)

(51) Int. Cl.
*H01L 23/00* (2006.01)
*H01L 23/31* (2006.01)
(Continued)

(52) U.S. Cl.
CPC ............ *H01L 24/17* (2013.01); *H01L 21/563* (2013.01); *H01L 23/3171* (2013.01); *H01L 23/522* (2013.01); *H01L 23/53238* (2013.01); *H01L 23/562* (2013.01); *H01L 23/585* (2013.01); *H01L 24/06* (2013.01); *H01L 24/11* (2013.01);
(Continued)

(58) Field of Classification Search
CPC ......... H01L 21/563; H01L 2225/06513; H01L 25/0657; H01L 2924/18161; H01L 23/3171; H01L 23/522; H01L 23/53238; H01L 23/562; H01L 23/585; H01L 24/81;
(Continued)

(56) References Cited

U.S. PATENT DOCUMENTS 5,872,393 A    2/1999  Sakai et al.
6,187,615 B1   2/2001  Kim et al.
(Continued)

FOREIGN PATENT DOCUMENTS

JP      01238148     9/1989
JP      2003100801   4/2003
(Continued)

*Primary Examiner* — Walter H Swanson
(74) *Attorney, Agent, or Firm* — Slater Matsil, LLP

(57) ABSTRACT

A device includes a metal pad over a substrate. A passivation layer includes a portion over the metal pad. A post-passivation interconnect (PPI) is electrically coupled to the metal pad, wherein the PPI comprises a portion over the metal pad and the passivation layer. A polymer layer is over the PPI. A dummy bump is over the polymer layer, wherein the dummy bump is electrically insulated from conductive features underlying the polymer layer.

20 Claims, 9 Drawing Sheets

Related U.S. Application Data division of application No. 13/211,438, filed on Aug. 17, 2011, now Pat. No. 8,912,649.

(51) Int. Cl.

| | | |
|---|---|---|
| *H01L 23/522* | (2006.01) | |
| *H01L 23/532* | (2006.01) | |
| *H01L 21/56* | (2006.01) | |
| *H01L 23/58* | (2006.01) | |
| *H01L 21/60* | (2006.01) | |

(52) U.S. Cl.
CPC .............. H01L 24/14 (2013.01); H01L 24/81 (2013.01); *H01L 24/13* (2013.01); *H01L 24/16* (2013.01); *H01L 2021/60255* (2013.01); *H01L 2224/0345* (2013.01); *H01L 2224/03912* (2013.01); *H01L 2224/0401* (2013.01); *H01L 2224/05005* (2013.01); *H01L 2224/05027* (2013.01); *H01L 2224/05166* (2013.01); *H01L 2224/05181* (2013.01); *H01L 2224/05186* (2013.01); *H01L 2224/05541* (2013.01); *H01L 2224/05572* (2013.01); *H01L 2224/05582* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/05664* (2013.01); *H01L 2224/05671* (2013.01); *H01L 2224/05684* (2013.01); *H01L 2224/1146* (2013.01); *H01L 2224/1147* (2013.01); *H01L 2224/11462* (2013.01); *H01L 2224/11464* (2013.01); *H01L 2224/13022* (2013.01); *H01L 2224/13082* (2013.01); *H01L 2224/13111* (2013.01); *H01L 2224/13139* (2013.01); *H01L 2224/13147* (2013.01); *H01L 2224/13155* (2013.01); *H01L 2224/13164* (2013.01); *H01L 2224/1403* (2013.01); *H01L 2224/14152* (2013.01); *H01L 2224/14179* (2013.01); *H01L 2224/16237* (2013.01); *H01L 2224/16238* (2013.01); *H01L 2224/17104* (2013.01); *H01L 2224/17517* (2013.01); *H01L 2224/73204* (2013.01); *H01L 2224/81007* (2013.01); *H01L 2224/81101* (2013.01); *H01L 2224/81191* (2013.01); *H01L 2224/81815* (2013.01); *H01L 2224/83104* (2013.01); *H01L 2924/15787* (2013.01); *H01L 2924/15788* (2013.01); *H01L 2924/35* (2013.01); *H01L 2924/3511* (2013.01)

(58) Field of Classification Search
CPC ......... H01L 24/11; H01L 24/14; H01L 24/17; H01L 24/06
USPC ........................................ 438/108
See application file for complete search history.

(56) References Cited

U.S. PATENT DOCUMENTS

| | | | |
|---|---|---|---|
| 6,677,677 | B2 | 1/2004 | Kimura et al. |
| 2003/0060035 | A1* | 3/2003 | Kimura ................ H01L 23/50 438/626 |
| 2004/0094842 | A1 | 5/2004 | Jimarez et al. |
| 2005/0104222 | A1* | 5/2005 | Jeong ..................... H01L 23/16 257/778 |
| 2007/0096313 | A1 | 5/2007 | Chou et al. |
| 2011/0095418 | A1 | 4/2011 | Lim et al. |
| 2011/0193219 | A1* | 8/2011 | Lai ......................... H01L 24/16 257/737 |
| 2011/0193235 | A1* | 8/2011 | Hu ...................... H01L 21/6835 257/773 |
| 2011/0248404 | A1 | 10/2011 | Chiu et al. |

FOREIGN PATENT DOCUMENTS

| | | |
|---|---|---|
| KR | 20000015326 | 3/2000 |
| KR | 1020050038499 | 4/2005 |
| KR | 1020110045222 | 5/2011 |
| TW | 200802645 | 1/2008 |

* cited by examiner

DUMMY FLIP CHIP BUMPS FOR REDUCING STRESS

PRIORITY CLAIM AND CROSS-REFERENCE

This application is a continuation of U.S. patent application Ser. No. 14/491,309, entitled "Dummy Flip Chip Bumps for Reducing Stress," filed Sep. 19, 2014, which application is a divisional of U.S. patent application Ser. No. 13/211,438, entitled "Dummy Flip Chip Bumps for Reducing Stress," filed on Aug. 17, 2011, now U.S. Pat. No. 8,912,649 B2, which applications are incorporated herein by reference.

BACKGROUND

Integrated circuits are typically formed on semiconductor chips. To increase manufacturing throughput and lower manufacturing cost, the integrated circuits are manufactured in semiconductor wafers, each containing many identical semiconductor chips. After the integrated circuits are manufactured, semiconductor chips are sawed from the wafers and packaged before they can be used.

In some packaging processes, semiconductor chips (also referred to as dies in the art) are bonded to package substrates. Underfill, which typically comprises epoxy, is used to further secure the bonding. The semiconductor chips may be bonded using flip-chip bonding or wire bonding. In the flip chip bonding process of a die to a package substrate, a re-flow process is performed so that the solder between the die and the package substrate is melted to join the die to the package substrate.

The conventional bonding process suffers from drawbacks. For example, during the re-flow process, the temperature of the package substrate is elevated. Since the package substrate is prone to warpage, after the reflow, package substrate may have warpage. With the warpage of the package substrate, the bumps at the center and the edges of the die and/or the package substrate are stretched or compressed. This causes stresses to be imparted to the low-k dielectric materials in the die, and delamination may occur to the low-k dielectric layers. In addition, the stresses may further cause the solder between the die and the package substrate to suffer from cracking.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A package structure comprising dummy bumps and the method of forming the same are provided in accordance with an embodiment. The intermediate stages of manufacturing various embodiments are illustrated. The variations of the embodiment are then discussed. Throughout the various views and illustrative embodiments, like reference numbers are used to designate like elements.

Figure 1:
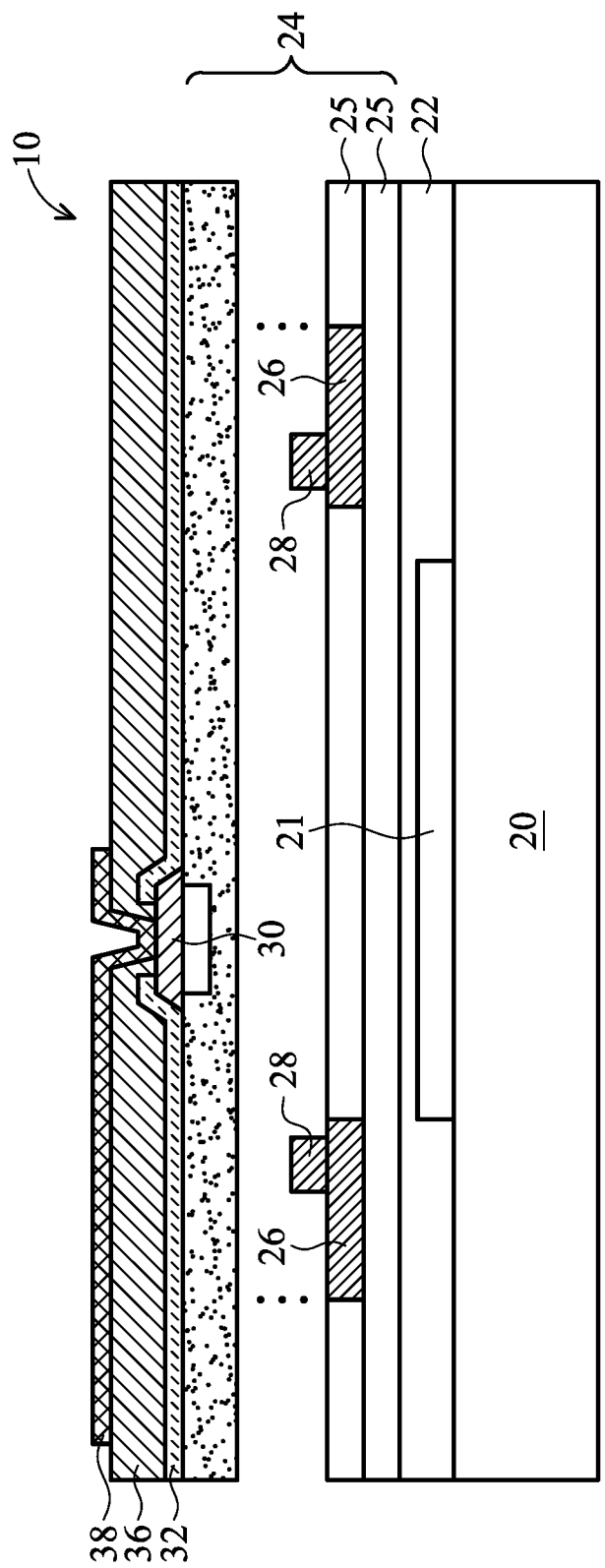
FIGS. 1 through 7 are cross-sectional views of intermediate stages in the manufacturing of a package in accordance with various embodiments.

Referring to FIG. 1, wafer 10, which includes semiconductor substrate 20, is provided. In an embodiment, wafer 10 is a device wafer, which may include active devices such as transistors therein. Accordingly, semiconductor substrate 20 may be a bulk silicon substrate or a silicon-on-insulator substrate. Other semiconductor materials including group III, group IV, and group V elements may also be used. In alternative embodiments, wafer 10 may be the wafer of other package components that do not include active devices therein, and may be an interposer wafer, for example. In the embodiments wherein wafer 10 does not include active devices, wafer 10 may include passive devices such as resistors and capacitors, or free from passive devices. Furthermore, in the embodiments wherein wafer 10 does not include active devices in, substrate 20 may be a dielectric substrate such as a glass substrate, a ceramic substrate, an organic substrate, or the like.

When wafer 10 is a device wafer, integrated circuit devices such as transistors (schematically illustrated as 21) are formed at the surface of semiconductor substrate 20. Wafer 10 may further include inter-layer dielectric (ILD) 22 over semiconductor substrate 20, and metal layers 24 over ILD 22. Metal layers 24, which include metal lines 26, are formed in dielectric layers 25, wherein metal lines 26 are further interconnected by vias 28. In an embodiment, dielectric layers 25 are formed of low-k dielectric materials. The dielectric constants (k values) of the low-k dielectric materials may be less than about 2.8, or less than about 2.5, for example. Metal lines 26 and vias 28 may be formed of copper or copper alloys, although they can also be formed of other metals.

Metal pad 30 is formed over metal layers 24, and may by electrically coupled to metal lines 26 and vias 28. Metal pad 30 may be aluminum pads or aluminum-copper pads, and hence is alternatively referred to as aluminum pad 30 hereinafter, although other metallic materials may be used. Passivation layer 32 is formed over metal layers 24. A portion of passivation layer 32 may cover edge portions of aluminum pad 30. The central portion of aluminum pad 30 is exposed through the opening in passivation layer 32. Passivation layer 32 may be a single layer or a composite layer, and may be formed of a non-porous material. In an embodiment, passivation layer 32 is formed of a composite layer comprising a silicon oxide layer (not shown), and a silicon nitride layer (not shown) over the silicon oxide layer. Passivation layer 32 may also be formed of un-doped silicate glass (USG), silicon oxynitride, and/or the like.

Polymer layer 36 is formed over passivation layer 32. Polymer layer 36 may be formed of a polymer such as an epoxy, polyimide, benzocyclobutene (BCB), polybenzoxazole (PBO), and the like. The formation methods include spin coating or other methods. Polymer layer 36 is patterned to form an opening, through which aluminum pad 30 is exposed. The patterning of polymer layer 36 may include photo lithography techniques. A curing may then be performed to cure polymer layer 36. Post-passivation interconnect (PPI) 38 is formed to electrically couple to aluminum pad 30 through the opening in polymer layer 36. PPI 38 is such named since the formation of PPI 38 is after the formation of passivation layer 32. PPI 38 may be formed of pure copper, substantially pure copper, a copper alloy, or other metals or metal alloys. PPI 38 may further include a nickel-containing layer. The formation methods include electro plating, electroless plating, sputtering, chemical vapor deposition methods, and the like.

Figure 2:
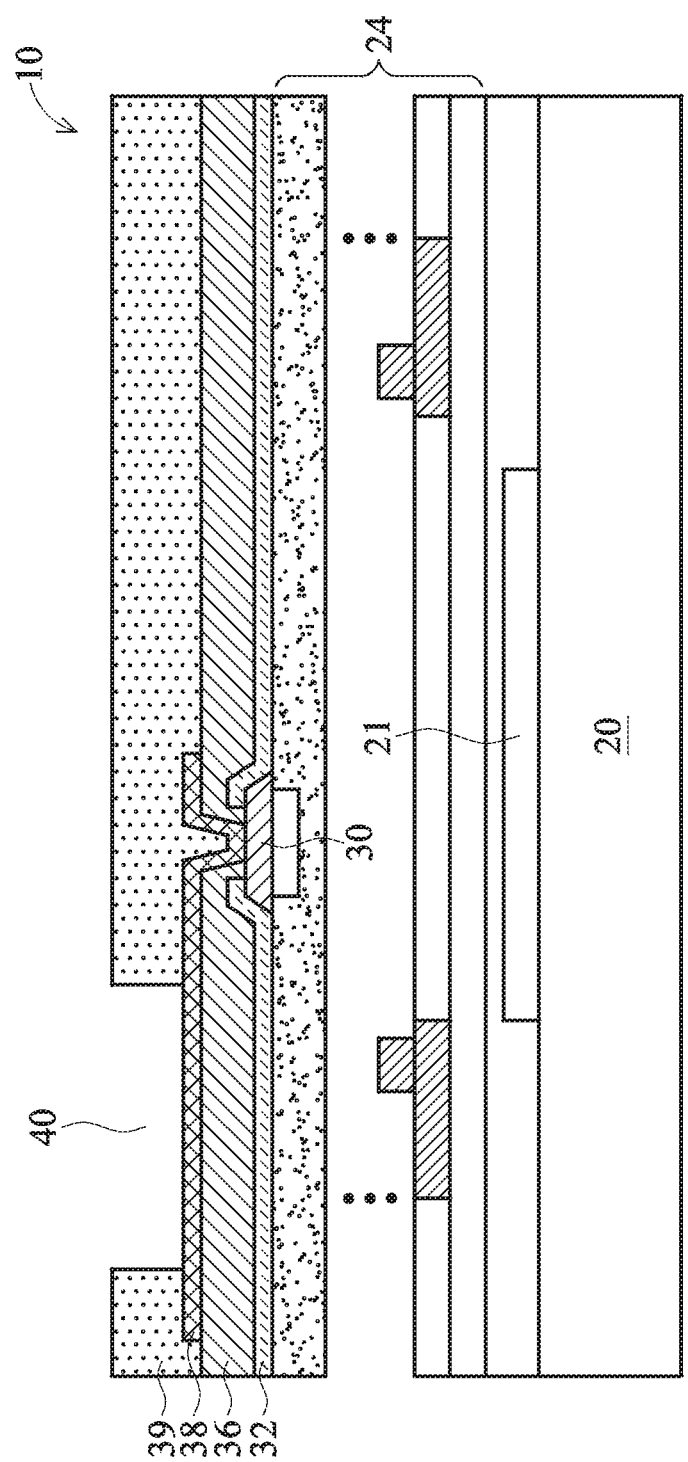

FIG. 2 illustrates the formation and the patterning of polymer layer 39. Polymer layer 39 may include a polymer, which may be polyimide or the like, and may be patterned using the same method as patterning polymer layer 36. After the patterning of polymer layer 39, a portion of PPI 38 is exposed through opening 40. In an embodiment wherein PPI 38 is formed of a copper-containing material, the surface of the copper-containing material may be exposed through opening 40 in polymer layer 39.

Figure 3:
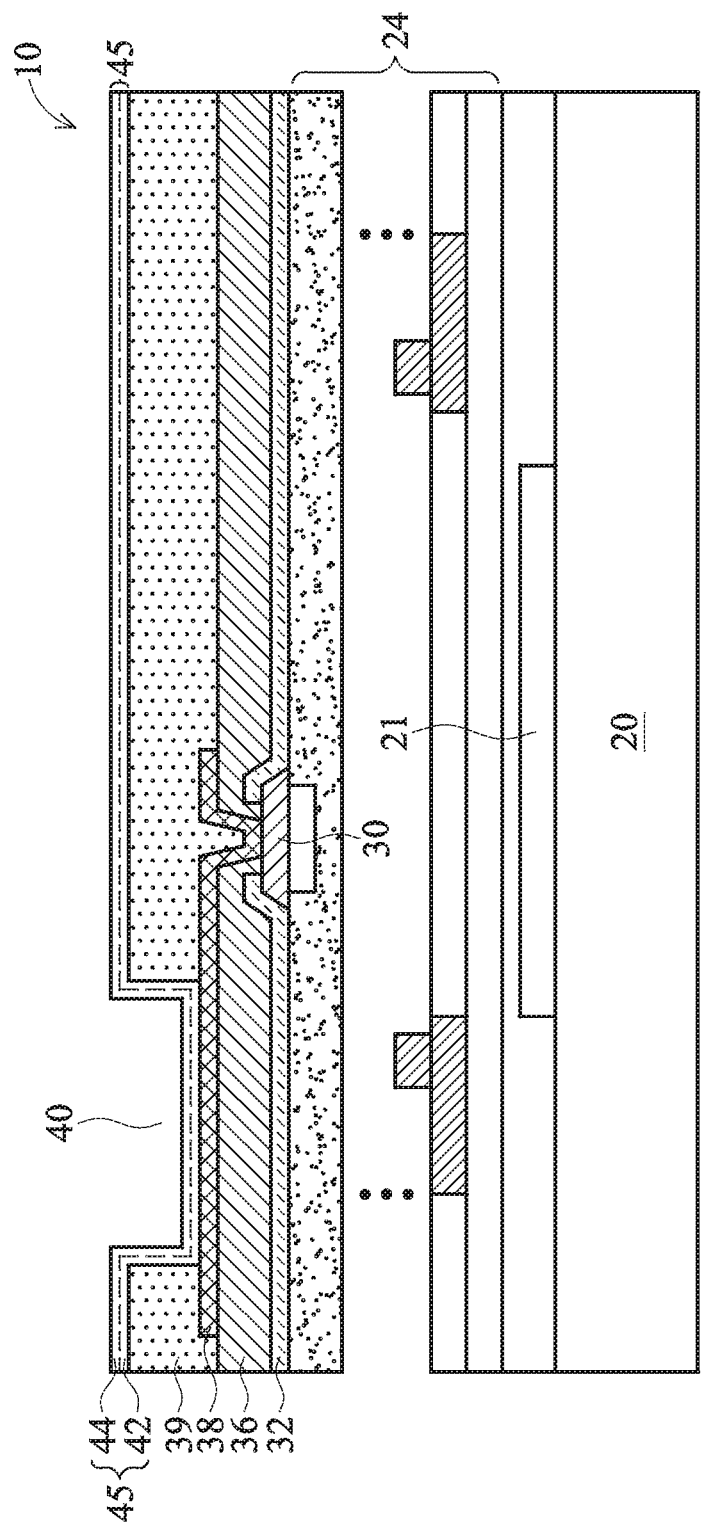

Referring to FIG. 3, under-bump metallurgy (UBM) layer 45 is formed. In an embodiment, UBM layer 45 includes barrier layer 42 and seed layer 44 over barrier layer 42. Barrier layer 42 extends into opening 40 and is electrically coupled to, and may be in physical contact with, PPI 38. Barrier layer 42 may be a titanium layer, a titanium nitride layer, a tantalum layer, a tantalum nitride layer, or a layer formed of a titanium alloy or a tantalum alloy. The materials of seed layer 44 may include copper or copper alloys, and hence seed layer 44 is alternatively referred to as a copper seed layer hereinafter. However, other metals such as silver, gold, aluminum, palladium, nickel, nickel alloys, tungsten alloys, chromium, chromium alloys, and combinations thereof may also be included. In an embodiment, barrier layer 42 and seed layer 44 are formed using physical vapor deposition (PVD) or other applicable methods. Barrier layer 42 may have a thickness between about 500 Å and about 2,000 Å. Seed layer 44 may have a thickness between about 1,000 Å and about 10,000 Å, although different thicknesses may be used.

Figure 4:
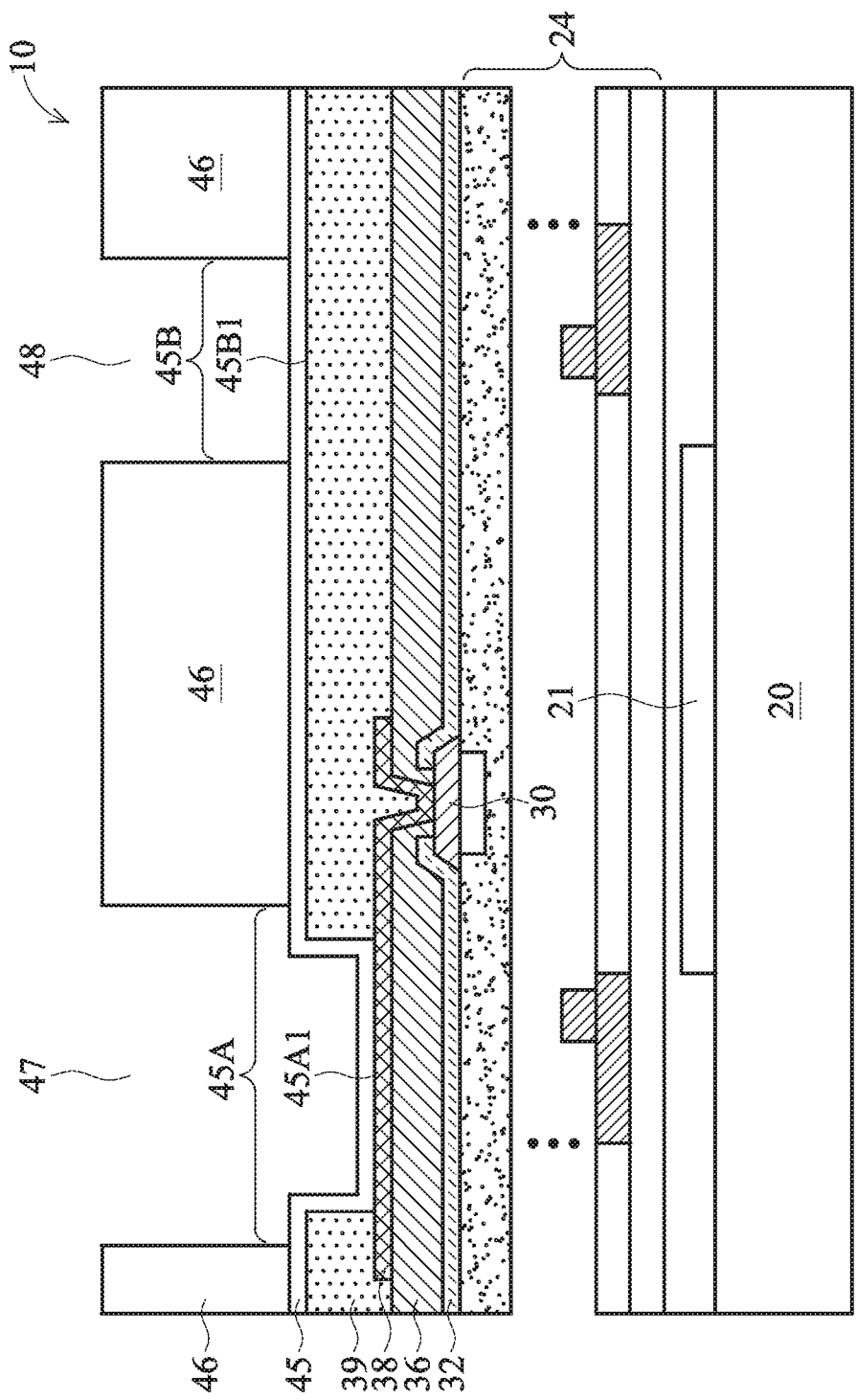

FIG. 4 illustrates the formation of mask 46, which may be formed of a photo resist or a dry film that is laminated on UBM layer 45, for example. Mask 46 is patterned, and portions of UBM layer 45 are exposed through openings 47 and 48 in mask 46, while some portions of UBM layer 45 are covered by mask 46. Opening 47 is directly over a metal pad of PPI 38. Opening 48, on the other hand, is formed over a portion of polymer layer 39, and may not have an underlying PPI pad. Accordingly, the exposed portion UBM 45A that is exposed through opening 47 may have bottom surface 45A1 contacting PPI 38, while the exposed portion UBM 45B that is exposed through opening 48 may have bottom surface 45B1 that is not in contact with any PPI pad. Instead, bottom surface 45B1 is in contact with an underlying dielectric material, which may be polymer layer 39 in some embodiments.

Figure 5:
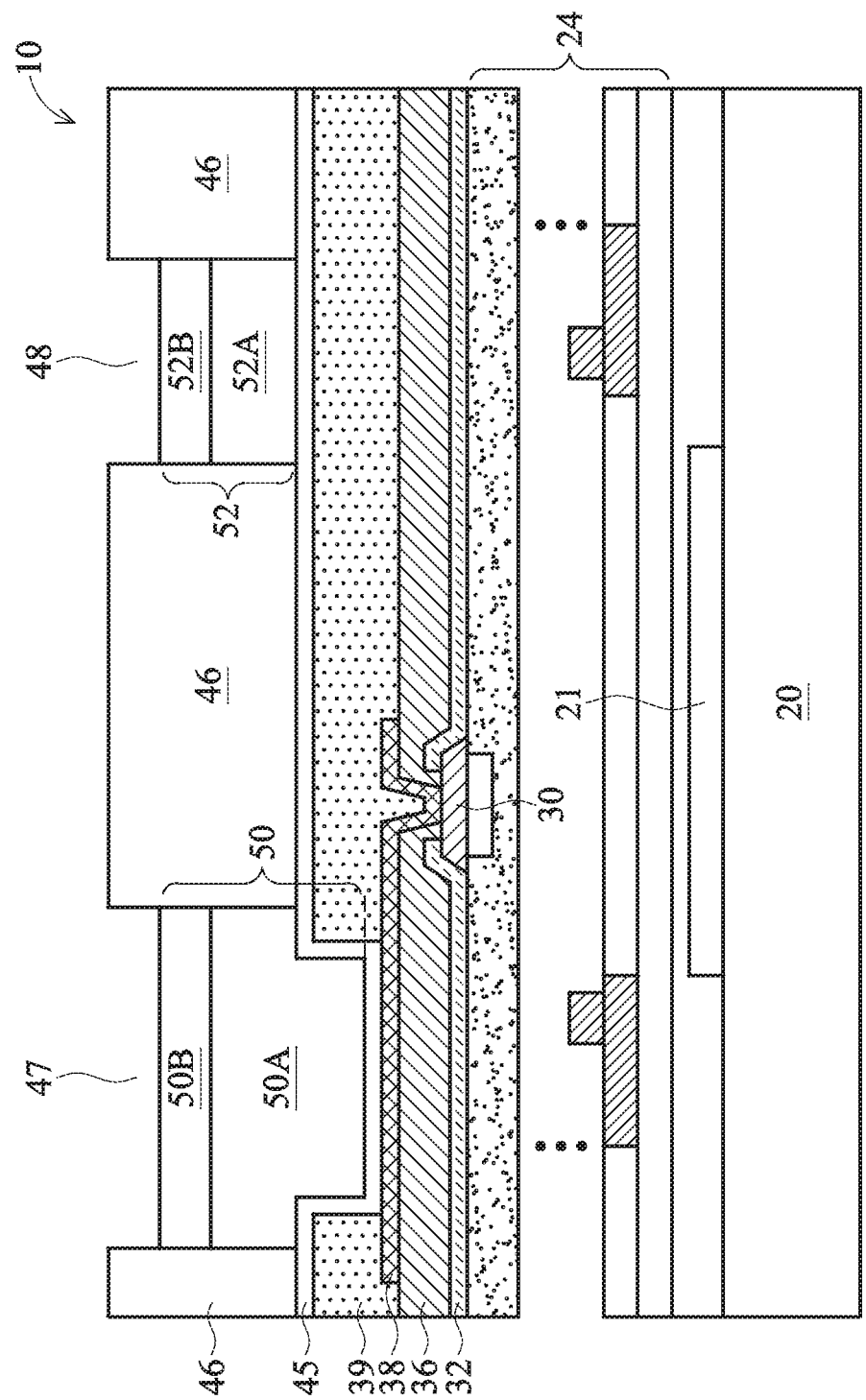

Next, as also shown in FIG. 5, metal bumps 50 and 52 are formed. In an embodiment, wafer 10 is placed into a plating solution (not shown), and a plating step is performed to form metal bumps 50 and 52 on UBM layer 45 and in openings 47 and 48, respectively. The plating may be an electro-plating, an electroless-plating, an immersion plating, or the like. In an exemplary embodiment, each of metal bumps 50 and 52 comprises a non-reflowable part that does not melt in the subsequent reflow processes. The non-reflowable parts are indicated as copper bumps 50A and 52A. Optionally, metal bumps 50 and 52 may include cap layer(s) selected from the group consisting of a nickel layer, a nickel alloy, a palladium layer, a gold layer, a silver layer, and multi-layers thereof, formed over copper bumps 50A and 52A. Metal bumps 50 and 52 may further include solder caps 50B and 52B, respectively, which may be formed of a Sn—Ag alloy, a Sn—Cu alloy, a Sn—Ag—Cu alloy, or the like, and may be lead-free or lead-containing.

Figure 6:
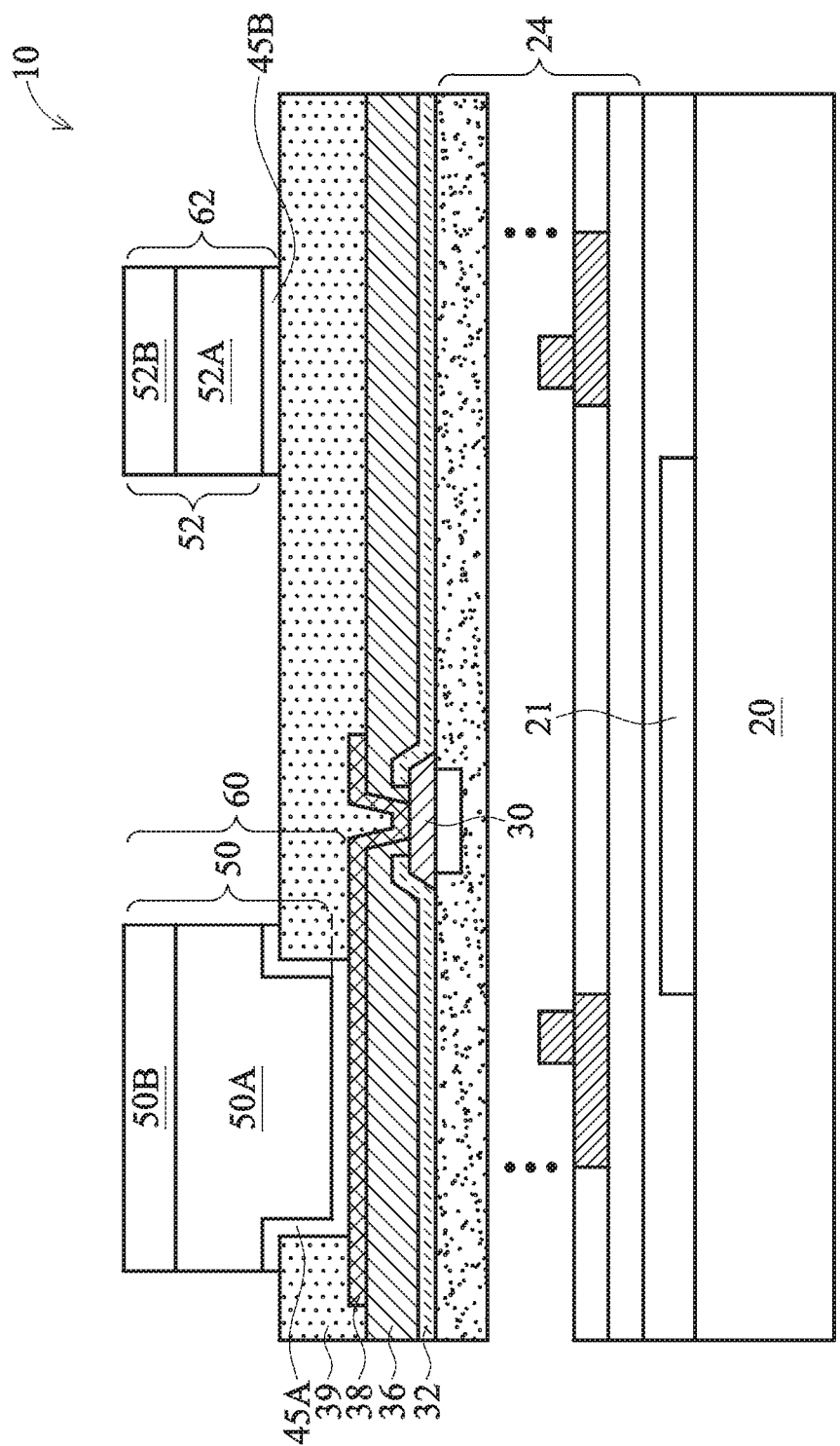

Referring to FIG. 6, after the formation of metal bump 50, mask 46 is removed, and the portions of UBM layer 45 that are previously covered by mask 46 are exposed. An etching step is them performed to remove the portions of UBM layer 45 that are not covered by metal bumps (such as metal bumps 50 and 52). In the resulting structure, UBM portion 45A and the overlying metal bump 50 in combination are referred to as electrical connector 60, and UBM portion 45B and the overlying metal bump 52 in combination are referred to as dummy bump 62. Electrical connector 60 is electrically coupled to metal pad 30. Dummy bump 62 is located directly over, and may be in physical contact with, polymer layer 39. Accordingly, dummy bump 62 does not have the function of electrically connecting to the features in wafer 10, and is not electrically coupled to any PPI.

Figure 8:
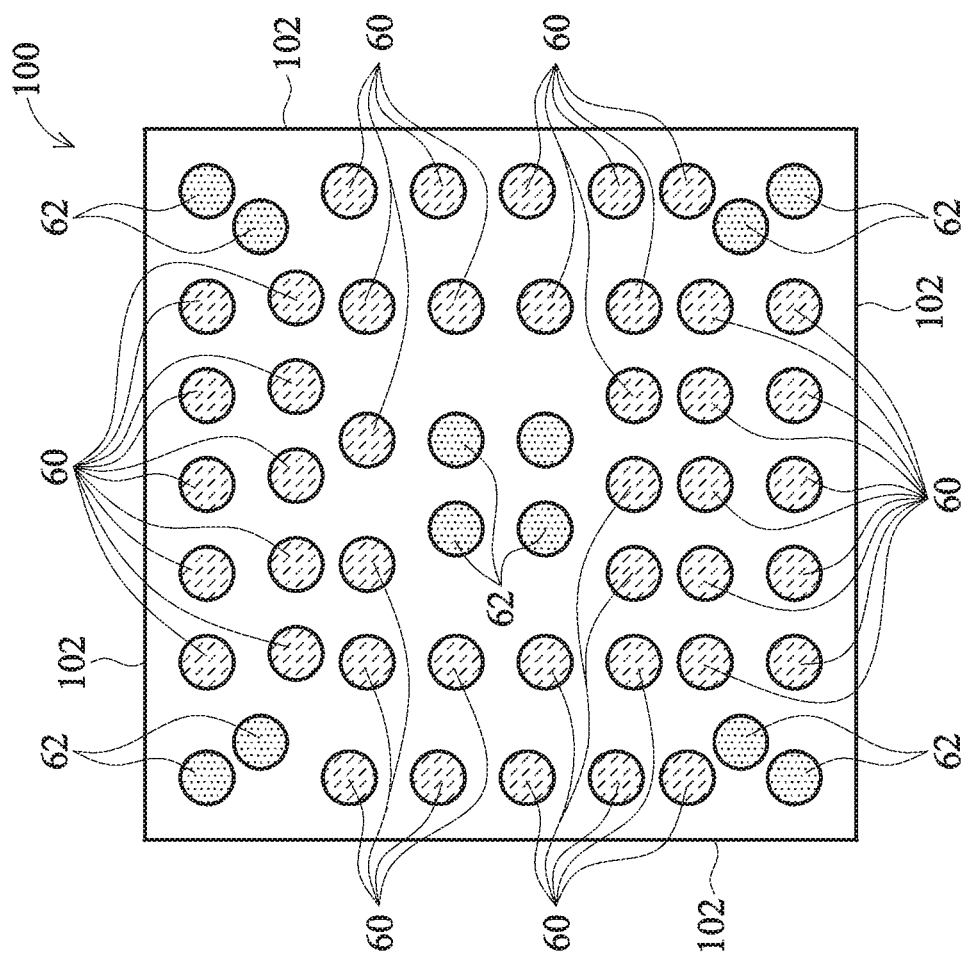
FIG. 8 illustrates a top view of a chip, wherein dummy bumps are distributed to high-stress regions of the chip.

FIG. 8 illustrates a top view of a portion of wafer 10 after the formation of electrical connector 60 and dummy bump 62. The illustrated portion is referred to package component 100 hereinafter. Package component 100 may be a device die when wafer 10 is a device wafer. Alternatively, package component 100 may be an interposer. Package component 100 has edges 102. A plurality of electrical connectors 60 and dummy bumps 62 may be formed at the surface of package component 100. In an embodiment, dummy bumps 62 are distributed to a plurality of portions in package component 100 that are subject to high stresses after package component 100 is bonded to other package components such as a package substrate. For example, dummy bumps 62 may be distributed to the center and four corners of package component 100, which portions of package component 100 have higher stresses than other portions. In other parts of package component 100, electrical connectors 60 that are electrically connected to the features inside package component 100 are disposed. In the illustrated embodiment, four dummy bumps 62 are disposed at the center of package component 100, and two dummy bumps 62 are disposed at each corner of package component 100, although more or fewer dummy bumps 62 may be disposed at each location. The rest of bumps may be electrical connectors 60.

Figure 7:
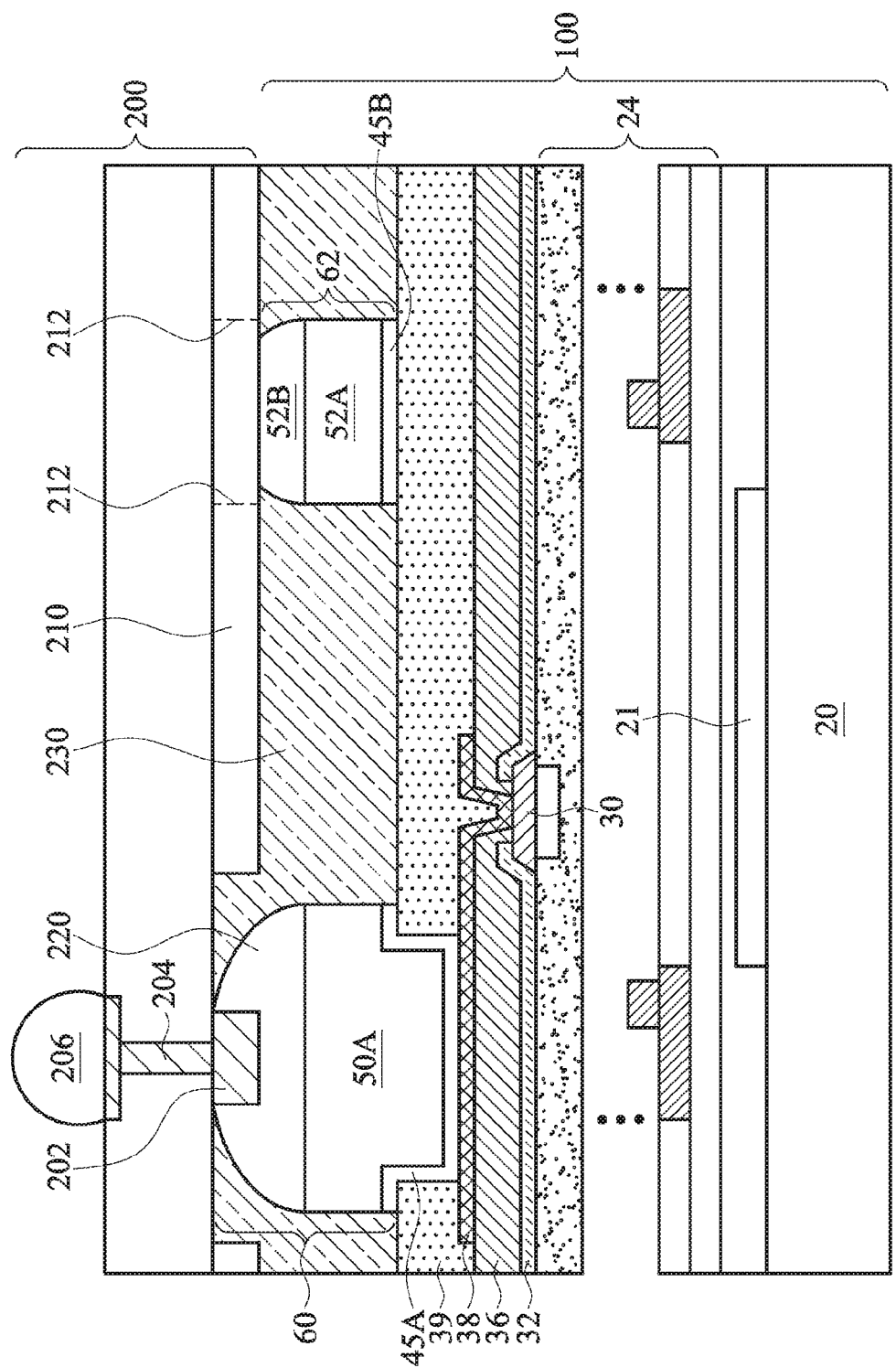

After the formation of electrical connectors 60 and dummy bumps 62, wafer 10 may be sawed into dies, wherein one of the dies is shown as package component 100 in FIG. 8. Package component 100 is then bonded to package component 200, as shown in FIG. 7. Alternatively, the bonding of package component 100 to package component 200 may be performed before the die saw of wafer 10, and hence the respective bonding is a wafer-to-wafer bonding. Package component 200 may be a device die comprising active devices such as transistors therein, or other package components having no active devices therein, such as a package substrate, an interposer, or the like. Package component 200 may also be a package that includes one or more device die, interposer, and/or package substrate, in any combination. Electrical connector 60 may be bonded to electrical connector 202, which may be a metal feature. Electrical connector 202 may be electrically coupled to feature 206 that is on the opposite side of package component 200 than electrical connector 202. In an embodiment, feature 206 is a solder bump, and is coupled to electrical connector 202 through metal lines and vias 204.

Dummy bump 60 may be in physical contact with dielectric layer 210 that is at the surface of package component 200. Accordingly, dummy bump 62 may be insulated from all metal features in package component 200, and may be electrically floating. Alternatively, dummy bump 62 may be bonded to bond pad 212, which is marked using dashed lines, in package component 200. However, bond pad 212 is not electrically coupled to any other conductive feature on the opposite side of package component 200, and may not be electrically coupled to any other conductive feature inside package component 200.

Figure 9:
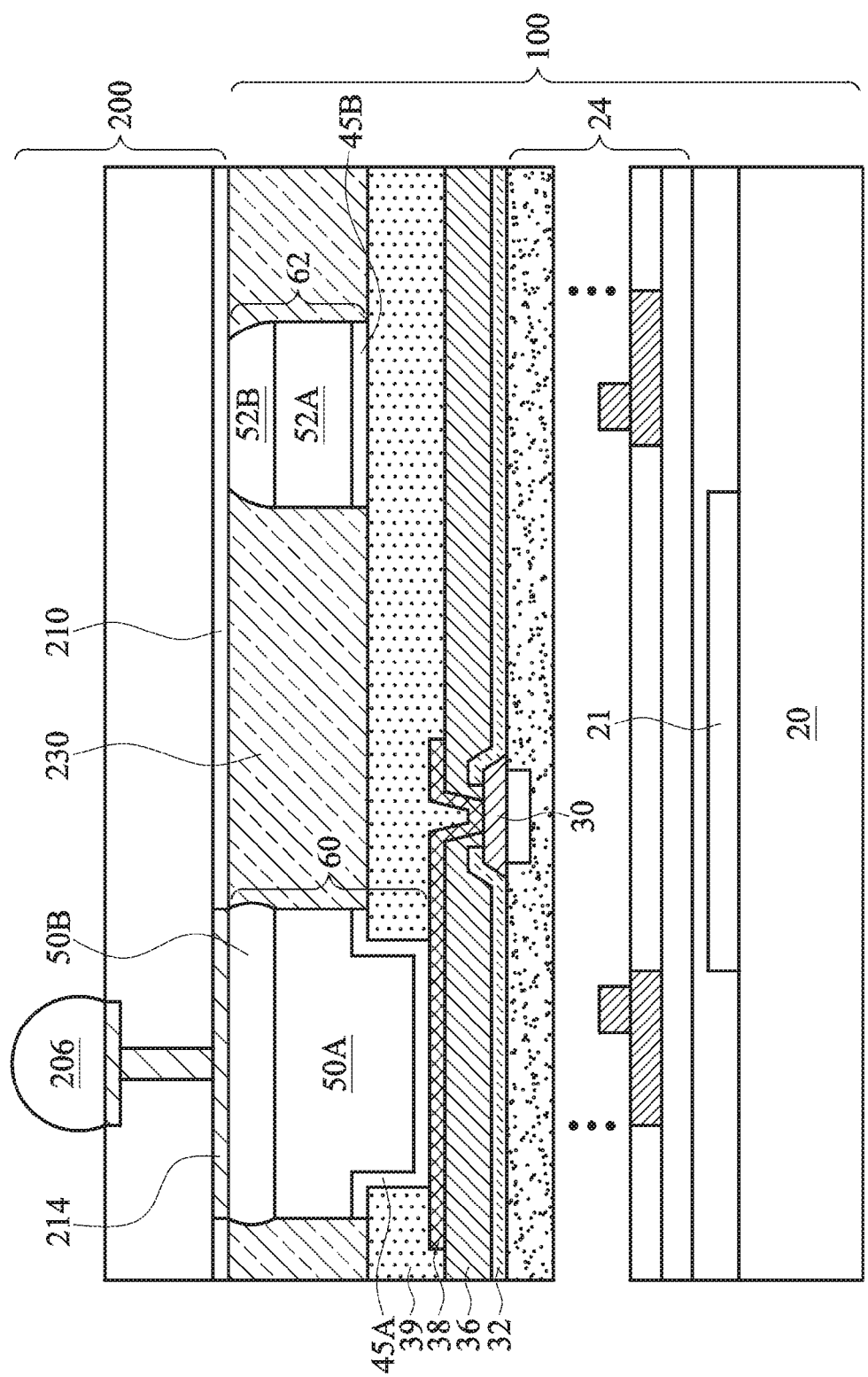
FIG. 9 illustrates a package in accordance with alternative embodiments.

FIG. 7 illustrates a bump on trace (BOT) structure, wherein metal feature 202 is a metal trace, and electrical connector 60 is bonded to metal trace 202, which the bond structure include solder 220 that is also bonded to sidewalls of metal trace 202. Solder 220 may include solder cap 50B in FIG. 6, and may optionally include the pre-solder that is pre-applied onto metal feature 202. In alternative embodiments, as shown in FIG. 9, electrical connector 60 may be bonded to bond pad 214 at a surface of package component 200, while dummy bump 62 is still electrically floating, and may be insulated from all conductive features in package component 200. After the bonding of package components 100 and 200 as in FIGS. 7 and 9, underfill 230 may be filled into the space between package components 100 and 200. Underfill 230 may be in physical contact with electrical connector 60 and dummy bump 62.

In the embodiments, dummy bump 62 (FIGS. 7 and 9) may not be connected to any PPI in package component 100. After the reflow process to bond package component 100 to package component 200, package components 100 and 200 may have warpage. When stresses are generated due to the warpage, dummy bumps 62 may impart the stresses to polymer layer 39, which is relative soft, so that the stress may be absorbed by polymer layer 39, rather than transferred to PPI 38 and the features inside package component 100. The reliability of package component 100 is thus improved. Similarly, on the side of package component 200, the stress is partially absorbed by dielectric layer 210, instead of directly applied to the metal pads, metal lines, and vias in package component 200.

In accordance with embodiments, a device includes a metal pad over a substrate. A passivation layer includes a portion over the metal pad. A PPI is electrically coupled to the metal pad, wherein the PPI comprises a portion over the metal pad and the passivation layer. A polymer layer is over the PPI. A dummy bump is over the polymer layer, wherein the dummy bump is electrically insulated from conductive features underlying the polymer layer.

In accordance with other embodiments, a device includes a first package component having an electrical connector, and a second package component bonded to the first package component through the first electrical connector. A dummy bump is located between the first package component and the second package component. The dummy bump is electrically insulated from conductive features in at least one of the first package component and the second package component.

In accordance with yet other embodiments, a method of forming a package component includes forming a passivation layer having a portion over a metal pad, and forming a PPI electrically coupled to the metal pad. The PPI has a portion over the metal pad and the passivation layer. A polymer layer is formed over the PPI. An electrical connector is formed over and electrically coupled to the PPI, wherein the electrical connector includes a portion over a top surface of the polymer layer. A dummy bump is formed over the polymer layer, wherein the dummy bump is insulated from all conductive features under the polymer layer.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
forming a first package component comprising:
 forming a first dielectric layer;
 removing a first portion of the first dielectric layer to form an opening, with a conductive feature underlying the first dielectric layer exposed through the opening;
 forming a conductive seed layer comprising a first portion extending into the opening to contact the conductive feature, and a second portion directly over the first dielectric layer;
 plating to form a metal bump over and contacting the first portion of the conductive seed layer, and a dummy bump over and contacting the second portion of the conductive seed layer; and
 etching the conductive seed layer to isolate the second portion of the conductive seed layer from remaining portions of the conductive seed layer.

2. The method of claim 1 further comprising bonding a second package component to the first package component through the metal bump, wherein after the bonding, a top surface of the dummy bump is in contact with a second dielectric layer in the second package component, with the first dielectric layer and the second dielectric layer contacting opposite surfaces of the dummy bump.

3. The method of claim 2, wherein the dummy bump comprises a non-solder region and a solder region over the non-solder region, and the solder region is in contact with the second dielectric layer of the second package component, and the non-solder region is in contact with the first dielectric layer.

4. The method of claim 2, wherein after the bonding, all surfaces of the dummy bump are in contact with dielectric materials.

5. The method of claim 1, wherein after the etching the conductive seed layer, the dummy bump is electrically de-coupled from all metal bumps in the first package component.

6. The method of claim 1, wherein the forming the first dielectric layer comprises forming a polymer layer.

7. A method comprising:
bonding a first package component to a second package component, wherein the first package component comprises:
 a metal pad;

a post-passivation interconnect (PPI) over and electrically coupled to the metal pad;

an electrical connector over and electrically coupled to the PPI; and a dummy bump at a same level as, and formed of same materials as, the electrical connector, wherein after the bonding, the electrical connector is bonded to a conductive feature in the second package component, the dummy bump is in contact with the second package component, and the dummy bump is electrically de-coupled from all conductive features in the second package component.

8. The method of claim 7, wherein the electrical connector and the dummy bump comprise a first solder region and a second solder region, respectively, and the first solder region is bonded to a conductive feature in the second package component, and a top surface of the second solder region is in contact with a dielectric layer in the second package component.

9. The method of claim 8, wherein after the bonding, an entirety of a top surface of the second solder region is in contact with the dielectric layer in the second package component.

10. The method of claim 7, wherein the first package component comprises a polymer layer over the PPI, wherein the electrical connector comprises a first Under-Bump Metallurgy (UBM) extending into the polymer layer to electrically couple to the PPI, and the dummy bump comprises a second UBM over the polymer layer.

11. The method of claim 10 further comprising forming the electrical connector and the dummy bump comprising:

forming an opening in the polymer layer to expose the PPI; and simultaneously plating a metallic material into the opening to form the electrical connector and over the polymer layer to form the dummy bump.

12. The method of claim 7 further comprising bonding the dummy bump to an electrically floating conductive feature in the second package component, wherein after the bonding the dummy bump to the electrically floating conductive feature, the dummy bump and the electrically floating conductive feature in the second package component remain to be electrically floating.

13. The method of claim 7 further comprising, after the bonding, filling an underfill, wherein the underfill encircles the electrical connector and the dummy bump.

14. The method of claim 7, wherein after the bonding, an entirety of the dummy bump is enclosed by dielectric materials.

15. A method comprising:

forming a first package component, wherein the forming the first package component comprises:

forming a post-passivation interconnect (PPI) electrically coupled to integrated circuits in the first package component;

forming a dielectric layer over the PPI;

forming an electrical connector, with a portion of the electrical connector extending into the dielectric layer to electrically couple to the PPI; and forming a dummy bump over the dielectric layer, wherein a bottom surface of the dummy bump is in contact with a top surface of the dielectric layer, and the electrical connector and the dummy bump are formed simultaneously.

16. The method of claim 15, wherein the dummy bump is insulated from all conductive features that are under the dielectric layer and in the first package component.

17. The method of claim 15, wherein the forming the electrical connector and the forming the dummy bump comprise plating a first solder cap and a second solder cap as top portions of the electrical connector and the dummy bump, respectively.

18. The method of claim 17 further comprising bonding the first package component to a second package component by bonding the electrical connector to a conductive feature in the second package component, wherein an entire top surface of the second solder cap is in contact with a dielectric material in the second package component.

19. The method of claim 17 further comprising bonding the first package component to a second package component by bonding the electrical connector to a conductive feature in the second package component, wherein the second solder cap is bonded to an additional conductive feature in the second package component, and the second solder cap remains to be electrically floating after the bonding.

20. The method of claim 15, wherein the forming the electrical connector and the forming the dummy bump comprise plating.

* * * * *